United States Patent
Roohparvar

(10) Patent No.: US 7,400,533 B2
(45) Date of Patent: Jul. 15, 2008

(54) MIMICKING PROGRAM VERIFY DRAIN RESISTANCE IN A MEMORY DEVICE

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 251 days.

(21) Appl. No.: 11/417,577

(22) Filed: May 4, 2006

(65) Prior Publication Data

US 2007/0258287 A1 Nov. 8, 2007

(51) Int. Cl.
*G11C 16/04* (2006.01)

(52) U.S. Cl. .............................. 365/185.17; 365/185.18; 365/185.22

(58) Field of Classification Search ............ 365/185.17, 365/185.18, 185.22
See application file for complete search history.

(56) References Cited

U.S. PATENT DOCUMENTS

| | | | |
|---|---|---|---|
| 5,528,546 A | 6/1996 | Chao et al. | |
| 6,330,189 B1 | 12/2001 | Sakui et al. | |
| 6,853,585 B2 | 2/2005 | Lee et al. | |
| 6,894,925 B1 | 5/2005 | Park et al. | |
| 7,006,382 B2 | 2/2006 | Pekny et al. | |
| 2007/0242522 A1* | 10/2007 | Hemink ................. | 365/185.24 |

* cited by examiner

*Primary Examiner*—Vu A Le
(74) *Attorney, Agent, or Firm*—Leffert Jay & Polglaze, P.A.

(57) ABSTRACT

A selected word line is biased with a program verify voltage. A predetermined quantity of unselected word lines that are between the selected word line and the bit line are biased with a modified $V_{pass}$ voltage that is determined in response to a predetermined drain resistance. In one embodiment, the predetermined quantity is all of the word lines. Other embodiments can use smaller quantities. The remaining unselected word lines are biased with a normal $V_{pass}$ voltage. The modified $V_{pass}$ changes the resistance of the memory cells, acting as pass-gates during the program verification operation, to mimic a resistance of already programmed memory cells.

26 Claims, 4 Drawing Sheets

MIMICKING PROGRAM VERIFY DRAIN RESISTANCE IN A MEMORY DEVICE

TECHNICAL FIELD OF THE INVENTION

The present invention relates generally to memory devices and in particular the present invention relates to non-volatile memory device architecture.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells take advantage of the analog nature of a traditional flash cell by assigning a bit pattern to a specific threshold voltage ($V_t$) range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a dead space or margin of 0.2V to 0.4V is between each range to keep the $V_t$ distributions from overlapping. If the voltage stored on the cell is within the first range, the cell is storing a logical 11 state and is typically considered the erased state of the cell. If the voltage is within the second range, the cell is storing a logical 01 state. This continues for as many ranges that are used for the cell provided these voltage ranges remain stable during the lifetime operation of the memory cell.

Since two or more states are stored in each MLC, the width of each of the voltage ranges for each state is very important. The cell $V_t$ distribution width is related to many variables in the operation of a memory circuit. For example, a cell could be verified at one temperature and read at a different temperature. The circuitry that determines if the cell is erased or programmed to the correct $V_t$ window has to make that determination. That circuitry has some of its characteristics influenced by temperature. A $V_t$ window is a sum of all of these types of differences, translating into a shift in the perceived window of the $V_t$. In order for the window to operate, the width of the four states plus a margin between each state should amount to the available window.

The available window is limited by the fact that a $V_{pass}$ voltage should turn on all of the cells in the NAND series string regardless of their logic states. This is because NAND cells are read in series in a string. Once a particular cell is accessed, all other cells in that string need to act like pass gates. If the $V_t$ of the highest cells is too high to open up the window of the $V_t$'s then the $V_{pass}$ has to be higher to allow those cells to be conductive. The higher the $V_{pass}$ voltage, the more disturb condition it introduces on the cells. This is counter productive to the tight window of the cell $V_t$'s.

One factor that causes a variation in the states that are not logical 11 is the variation due to the program verify operation. In NAND MLC, the cells are programmed upward from the source side of the string. Thus, the entire string above the programmed word line starts as erased. As discussed previously, these cells are biased with $V_{pass}$ on the word line in order to turn them on when a cell is being read or verified. However, the cell conductance is impacted, depending on the cell $V_t$ value.

For example, when cell 0 in the string experiences a verify operation, all of the 31 cells above it are in the logical 11 erased state. In other words, a $V_t$ of −1V for each cell. If it is assumed that the data pattern for that string happens to be all logical 00, during the read operation, all of the 31 cells will be programmed with a $V_t$ of 3V to 4V. The overdrive from the $V_{pass}$ is much smaller, causing a higher drain resistance for the cell during a read operation. This causes the cell current to be degraded, translating into a potential 200 mV window loss. Since some of the cells could have remained erased or programmed with different data patterns, the amount of degradation cannot be predicted.

For the reasons stated above, and for other reasons stated below which will become apparent to those skilled in the art upon reading and understanding the present specification, there is a need in the art for a memory device that reduces the cell degradation during a program verify operation.

DETAILED DESCRIPTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Figure 1:
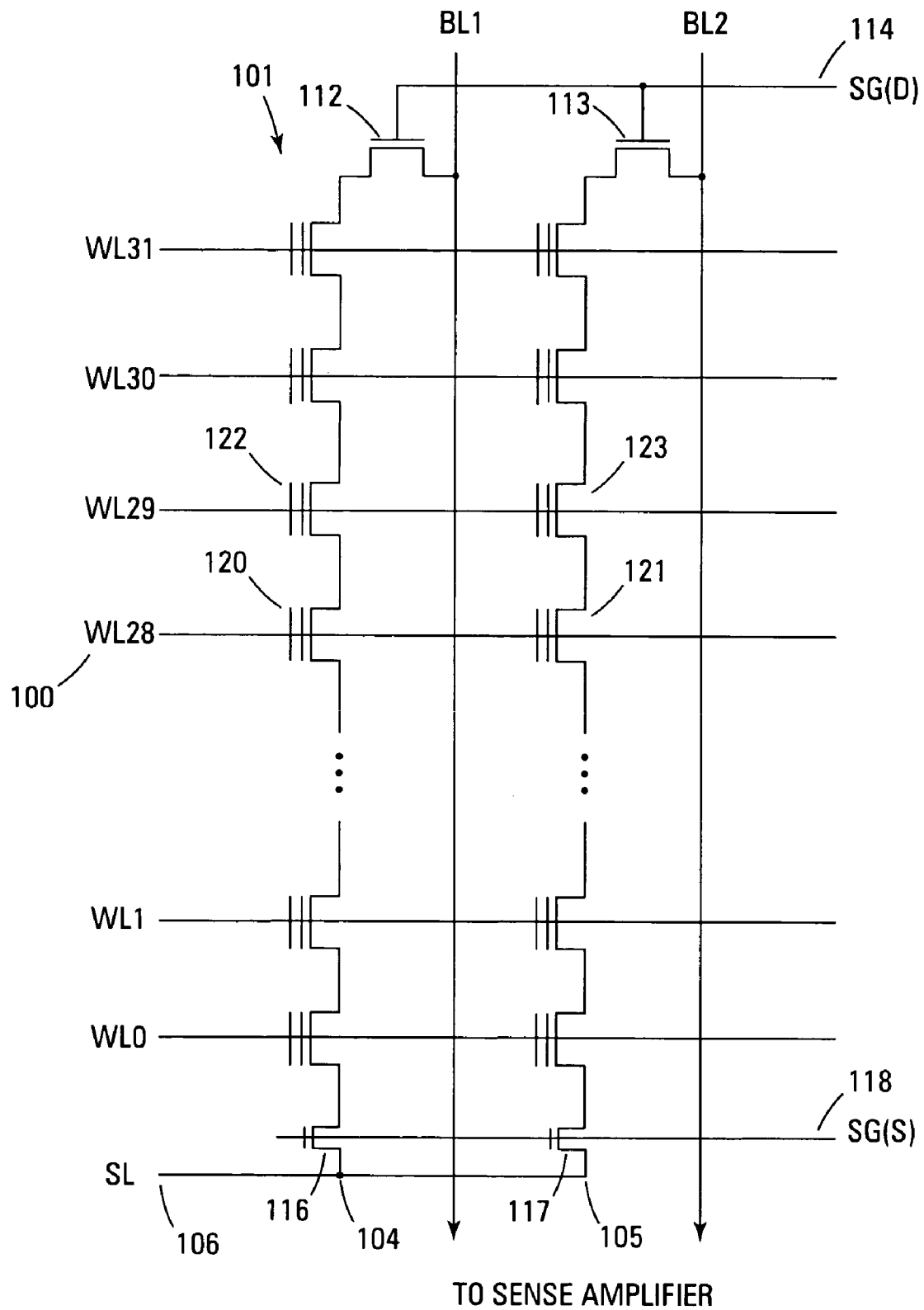
FIG. 1 shows a schematic diagram of one embodiment of a NAND flash memory array.

FIG. 1 illustrates a simplified diagram of one embodiment for a NAND flash memory array of the present invention. The memory array of FIG. 1, for purposes of clarity, does not show all of the elements typically required in a memory array. For example, only two bit lines are shown (BL1 and BL2) when the number of bit lines required actually depends upon the memory density. Additionally, each memory column extends vertically, substantially repeating the series strings of memory cells between two select gates.

The array is comprised of an array of floating gate cells 101 arranged in series strings 104, 105. Each of the floating gate cells 101 are coupled drain to source in each series string 104, 105. A word line (WL0-WL31) that spans across multiple series strings 104, 105 is coupled to the control gates of every floating gate cell in a row in order to control their operation. The embodiment of FIG. 1 shows 32 word lines per memory block. Alternate embodiments could have different quantities of word lines such as 8, 16, or more.

In operation, the word lines (WL0-WL31) select the individual floating gate memory cells in the series string 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bit line (BL1 and BL2) by a drain select gate 112, 113. The bit lines (BL1 and BL2) are eventually coupled to sense amplifiers (not shown) that detect the state of each cell.

The source select gates 116, 117 are controlled by a source select gate control line SG(S) 118 coupled to their control gates. The drain select gates 112, 113 are controlled by a drain select gate control line SG(D) 114.

Each cell can be programmed as a single bit per cell (SBC) or multiple bits per cell (i.e., multilevel cell—MLC). Each cell's threshold voltage ($V_t$) determines the data that is stored in the cell. For example, in an SBC, a $V_t$ of 0.5V might indicate a programmed cell while a $V_t$ of −0.5V might indicate an erased cell.

During a typical programming operation, the selected word line for the flash memory cell to be programmed is biased with a series of programming pulses that might start at approximately 16V and increase incrementally if a program verify operation determines the cell is not programmed. The unselected word lines for the unselected cells are typically biased at approximately 10V during the program operation.

The program verification operation with a word line voltage (e.g., 0.5V) is performed to determine if the cell threshold voltage has been increased to the corresponding $V_t$ level in the program operation. A typical prior art method for program verify would bias the unselected word lines with a $V_{pass}$ voltage of approximately 5.8V.

The program verify operation of the present invention biases the unselected word lines assuming that half of the cells above the cell being verified are programmed. This mimics the expected resistance of half the cells being programmed and, thus, tightens the distribution and, on average, makes the typical prior art 200 mV window loss into approximately a +/−100 mV loss.

Figure 2:
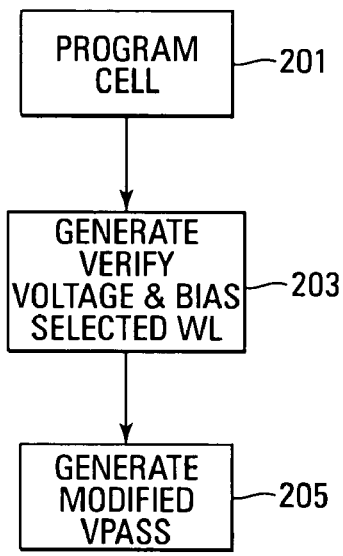
FIG. 2 shows a flowchart of one embodiment of a method of the present invention for mimicking drain resistance of a program verify operation.

FIG. 2 illustrates a flowchart of one embodiment of a method of the present invention for mimicking drain resistance of a program verify operation. A program operation is performed 201 in order to program the desired data into a particular cell. In one embodiment, the cells are programmed from the word line that is closest to the source line of a memory block. As discussed previously, the program operation is comprised of at least one program pulse that biases the word line/control gate(s) of the cell or cells to be programmed. In one embodiment, the initial program pulse is approximately 16V. Alternate embodiments can use other initial program pulses.

After the program operation, the program verify operation of the present invention is then performed. The program verify operation includes generating a $V_{gs}$ voltage that biases the selected word line 203. In one embodiment, this voltage is 0V. Alternate embodiments can use other program verify voltages.

The program verify operation of the present invention generates an average drain resistance that would exist from the drain of the selected cell to the bit line assuming half of the cells above the selected cell are programmed. In the embodiment of FIG. 2, this is accomplished by biasing the control gates/word lines of the cells above the selected cell with a modified $V_{pass}$ voltage that is less than the normal $V_{pass}$ voltage of approximately 5.8V 205. This reduced voltage only partially turns on each transistor, thus changing its resistance while it acts as a pass-gate. The word lines between the cell being programmed/verified and the source line are biased with an unmodified $V_{pass}$ voltage (e.g., 5.8V).

In one embodiment, the modified $V_{pass}$ voltage is determined by experimentation. For example, during fabrication and testing of the memory integrated circuit, the different resistances generated as a result of different modified $V_{pass}$ voltages applied to the word lines is determined. The desired resistance is then chosen with the corresponding modified $V_{pass}$ that generated that particular resistance. Alternate embodiments may use other methods to determine the modified $V_{pass}$.

Additional program pulses may be required depending on the result of the subsequent program verify operation. If the program verify operation determines that the cell has not reached the necessary $V_t$ for the logical state to be programmed, the program/verify process repeats until the threshold voltage is reached. Each subsequent program pulse after the initial program pulse is increased by some incremental voltage.

Figure 3:
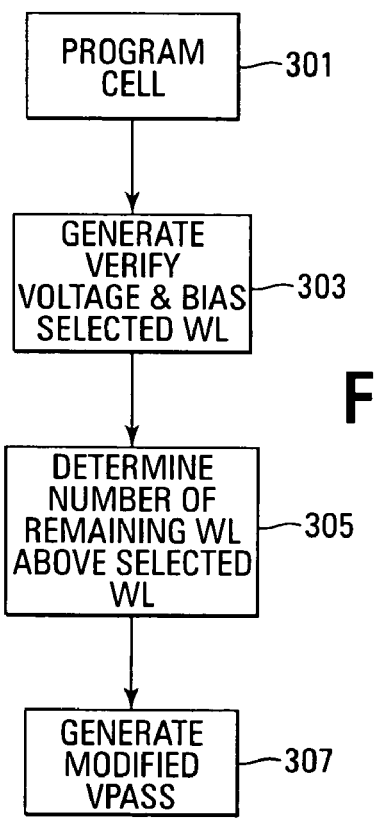
FIG. 3 shows a flowchart of an alternate embodiment of the method of the present invention for mimicking drain resistance of a program operation.

FIG. 3 illustrates a flowchart of an alternate embodiment of the method of the present invention for mimicking drain resistance of a program verify operation. This embodiment starts with the program operation 301 as described previously. The verify voltage is generated to bias the selected word line 303.

The embodiment of FIG. 3 adjusts the drain resistance by changing the modified $V_{pass}$ in response to the quantity of word lines remaining above the selected word line. In other words, as the cell to be programmed/verified moves upward from the source line of the memory block to the bit line of the series string and the quantity of remaining word lines changes, the modified $V_{pass}$ level changes. In one embodiment, since there are fewer memory cells to create a resistance, the modified $V_{pass}$ is reduced as the programmed/verified cell moves upward. This turns on each pass-gate memory cell less, thus increasing its resistance. In this manner, the perceived resistance remains substantially the same but the resistance of each memory cell increases.

The quantity of word lines remaining above the selected word line is then determined 305 after each program/verify operation in order to generate an appropriate modified $V_{pass}$ 307. As in the prior embodiment, the resistance generated by a corresponding modified $V_{pass}$ can be determined during fabrication and stored in the memory device in table form. Thus, the controller can determine the quantity of remaining word lines and access the table to determine the corresponding modified $V_{pass}$ to generate the desired resistance. This modified $V_{pass}$ is then used to bias the remaining word lines. The unselected word lines between the selected word line and the source line are biased with the normal, unmodified $V_{pass}$.

Figure 4:
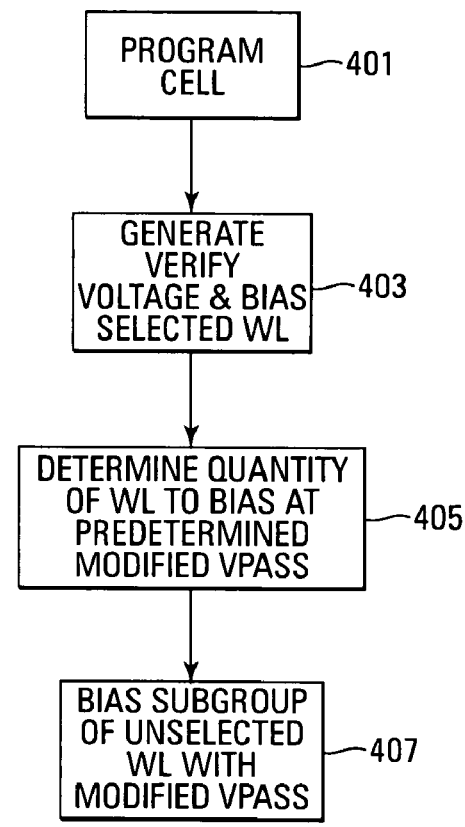
FIG. 4 shows a flowchart of another alternate embodiment of the method of the present invention for mimicking drain resistance of a program operation.

FIG. 4 illustrates a flowchart of another alternate embodiment of the method of the present invention for mimicking drain resistance of a program verify operation. As in prior embodiments, the programming operation is performed on the desired cell 401. The select word line bias voltage for the verify operation is generated 403.

The embodiment of FIG. 4 selects only a subgroup of unselected word lines, above the selected word line, comprising a predetermined quantity of word lines that are to be biased with the modified $V_{pass}$ voltage. For example, a fixed modified $V_{pass}$ is already known so the quantity of pass-gate memory cells required to generate the desired resistance at that voltage is determined 405. The subgroup of unselected word lines is biased with the predetermined modified $V_{pass}$ 407. The remaining unselected word lines above the selected cell (i.e., between the drain of the selected WL and the bit line) are biased at the normal $V_{pass}$. The unselected word lines below the selected word line (i.e., between the selected WL and the source line) are also biased at the normal $V_{pass}$.

The above-described embodiments are for purposes of illustration only. The present invention is not limited to any one way to mimic the drain resistance of a program verify operation.

The above-described embodiments of the present invention can be done in either a single level cell or a multilevel cell memory array. The present invention is not limited to the quantity of bits to be programmed into each cell.

Figure 5:
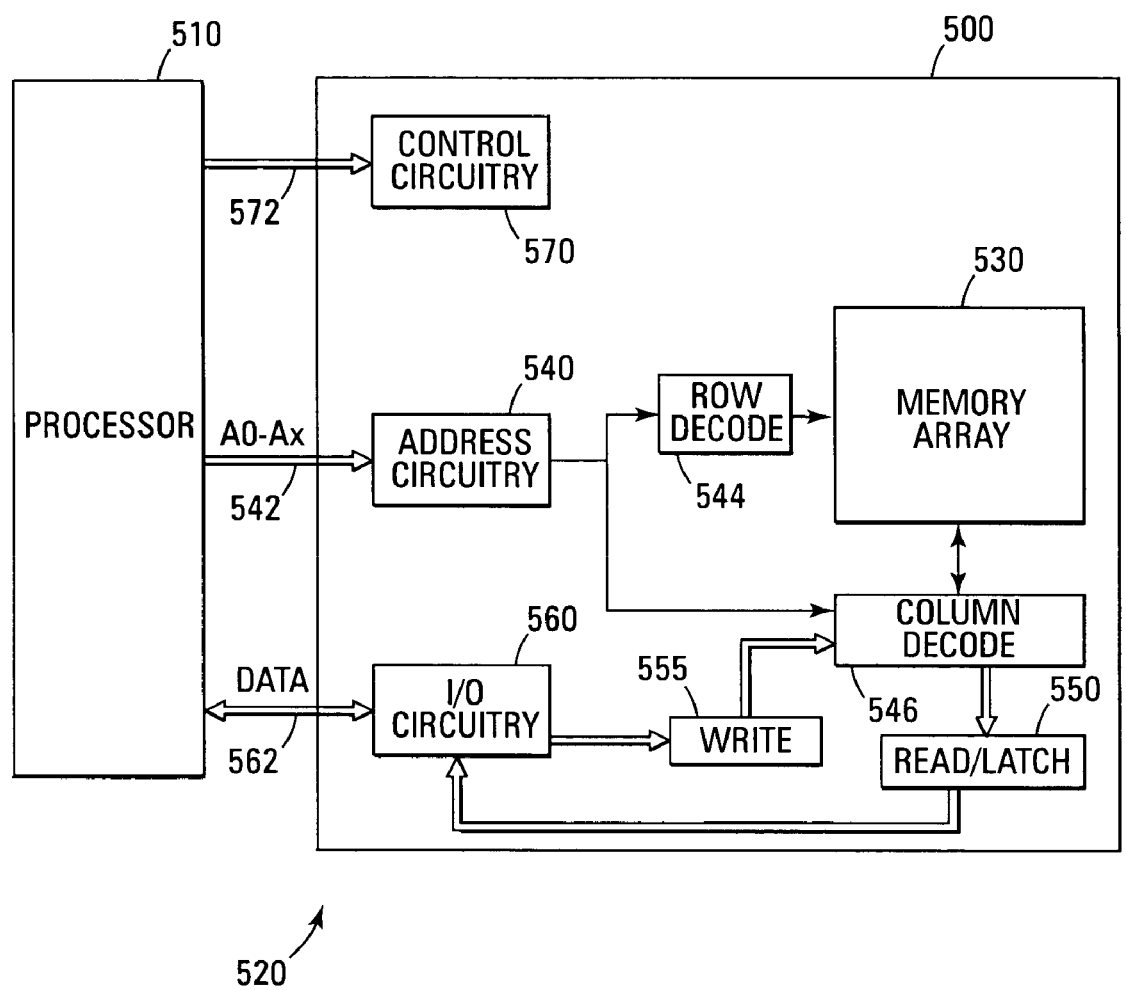
FIG. 5 shows a block diagram of an electronic memory system of the present invention.

FIG. 5 illustrates a functional block diagram of a memory device 500 that can incorporate the non-volatile memory cells of the present invention. The memory device 500 is coupled to a processor 510. The processor 510 may be a microprocessor or some other type of controlling circuitry. The memory device 500 and the processor 510 form part of an electronic memory system 520. The memory device 500 has been simplified to focus on features of the memory that are helpful in understanding the present invention.

The memory device includes an array of non-volatile memory cells 530 that can be floating gate flash memory cells. The memory array 530 is arranged in banks of rows and columns. The control gates of each row of memory cells are coupled with a word line while the drain regions of the memory cells are coupled to bit lines. The source regions of the memory cells are coupled to source lines. As is well known in the art, the connection of the cells to the bit lines and source lines depends on whether the array is a NAND architecture, a NOR architecture, an AND architecture or some other memory array architecture.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory integrated circuit 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write, and erase operations. In one embodiment, the control circuitry 570 is responsible for executing the methods of the present invention. The control circuitry 570 may be a state machine, a sequencer, or some other type of controller.

The non-volatile memory device illustrated in FIG. 5 has been simplified to facilitate a basic understanding of the features of the memory. A more detailed understanding of internal circuitry and functions of flash memories are known to those skilled in the art.

Figure 6:
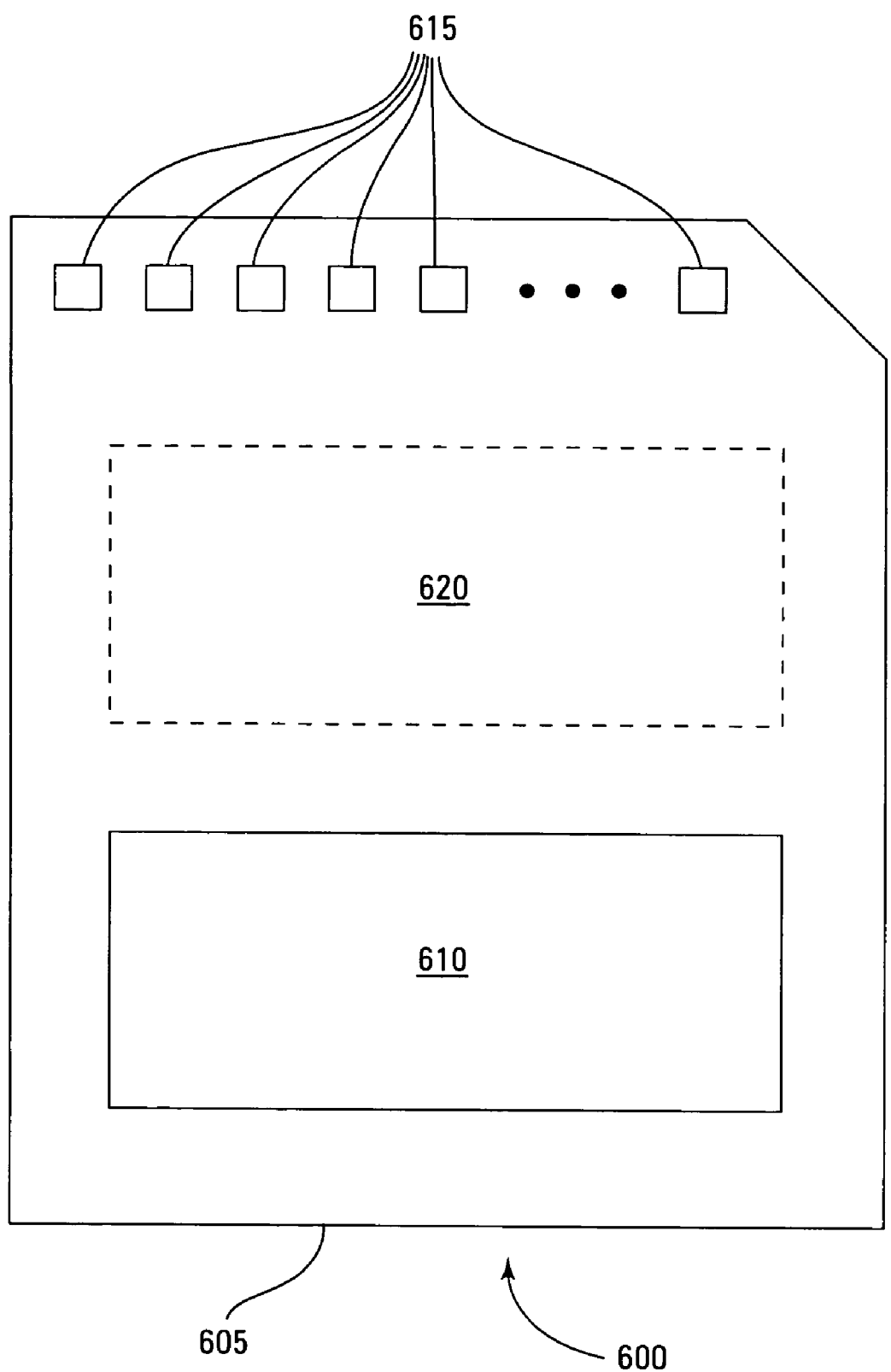
FIG. 6 shows a block diagram of one embodiment of a memory module of the present invention.

FIG. 6 is an illustration of an exemplary memory module 600. Memory module 600 is illustrated as a memory card, although the concepts discussed with reference to memory module 600 are applicable to other types of removable or portable memory, e.g., USB flash drives, and are intended to be within the scope of "memory module" as used herein. In addition, although one example form factor is depicted in FIG. 6, these concepts are applicable to other form factors as well.

In some embodiments, the memory module 600 includes a housing 605 (as depicted) to enclose one or more memory devices 610, though such a housing is not essential to all devices or device applications. At least one memory device 610 is a non-volatile memory [including or adapted to perform elements of the invention]. Where present, the housing 605 includes one or more contacts 615 for communication with a host device. Examples of host devices include digital cameras, digital recording and playback devices, PDAs, personal computers, memory card readers, interface hubs and the like. For some embodiments, the contacts 615 are in the form of a standardized interface. For example, with a USB flash drive, the contacts 615 might be in the form of a USB Type-A male connector. For some embodiments, the contacts 615 are in the form of a semi-proprietary interface, such as might be found on COMPACTFLASH memory cards licensed by SANDISK Corporation, MEMORYSTICK memory cards licensed by SONY Corporation, SD SECURE DIGITAL memory cards licensed by TOSHIBA Corporation and the like. In general, however, contacts 615 provide an interface for passing control, address and/or data signals between the memory module 600 and a host having compatible receptors for the contacts 615.

The memory module 600 may optionally include additional circuitry 620 that may be one or more integrated circuits and/or discrete components. For some embodiments, the additional circuitry 620 may include a memory controller for controlling access across multiple memory devices 610 and/or for providing a translation layer between an external host and a memory device 610. For example, there may not be a one-to-one correspondence between the number of contacts 615 and a number of I/O connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as a logic functions as might be performed by an ASIC (application specific integrated circuit). Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

In summary, the embodiments of the present invention include a NAND flash memory integrated circuit and methods for mimicking an expected drain resistance between a selected memory cell being programmed and the bit line of the series string. This can be accomplished in various ways including by generating a modified $V_{pass}$ voltage that assumes that half the cells between the selected cell and the drain line are programmed. Another method might bias only a select quantity of cells with a modified $V_{pass}$. Yet another method can change the modified $V_{pass}$ as the number of unselected cells above the selected cell changes.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for mimicking a drain resistance of a program verify operation in a memory array having a series string of memory cells between a source line and a bit line, the method comprising:
   biasing a selected word line with a program verify voltage; and
   biasing unselected word lines between the selected word line and the bit line with a modified $V_{pass}$ voltage that is determined in response to a predetermined drain resistance.

2. The method of claim 1 and further including biasing unselected word lines between the selected word line and the source line with a $V_{pass}$ voltage.

3. The method of claim 1 wherein the program verify voltage is 0V.

4. The method of claim 2 wherein the $V_{pass}$ voltage is substantially equal to 5.8V.

5. The method of claim 2 wherein the modified $V_{pass}$ voltage is less than the $V_{pass}$ voltage.

6. The method of claim 1 wherein the predetermined drain resistance is a predetermined resistance of a plurality of programmed memory cells acting as pass-gates.

7. The method of claim 6 wherein the plurality of programmed memory cells is a quantity of memory cells substantially equal to half of the quantity of memory cells between the selected word line and the drain line.

8. The method of claim 7 wherein the selected word line is the word line adjacent to the source line and the quantity of memory cells is thirty-one.

9. A method for mimicking a drain resistance of a program verify operation in a NAND flash memory array having a series string of memory cells between a source line and a bit line, the method comprising:
   programming a selected memory cell of the series string;
   biasing the selected memory cell with a program verify voltage; and
   biasing unselected word lines between the selected word line and the bit line with a modified $V_{pass}$ voltage that is determined in response to a predetermined drain resistance.

10. The method of claim 9 wherein the programming comprises programming in a direction from a memory cell closest to the source line and moving towards the bit line.

11. The method of claim 9 wherein the predetermined drain resistance is substantially equal to a drain resistance resulting from half the memory cells, between the selected memory cell and the bit line, being programmed.

12. The method of claim 10 wherein the modified $V_{pass}$ voltage decreases as the selected memory cell moves towards the bit line.

13. The method of claim 9 wherein programming comprises a series of voltage pulses of incrementally increasing value.

14. A method for mimicking a drain resistance of a program verify operation in a memory array having a series string of memory cells between a source line and a drain line, the method comprising:
   biasing a selected word line with a program verify voltage; and
   biasing a predetermined quantity of unselected word lines between the selected word line and the bit line with a modified $V_{pass}$ voltage that is determined in response to a predetermined drain resistance wherein the predetermined quantity of unselected word lines is less than a number of word lines between the selected word line and the bit line.

15. The method of claim 14 and further including biasing any remaining word lines not biased with the modified $V_{pass}$ voltage with a $V_{pass}$ voltage that is greater than the modified $V_{pass}$.

16. The method of claim 14 wherein the memory array is a NAND flash memory array.

17. A non-volatile memory device comprising:
   a memory array comprising a plurality of rows coupled by word lines and a plurality of memory cell series string columns, each coupled between a source line and a bit line; and
   a memory control circuit coupled to the memory array and adapted to control operation of the memory device such that a program verify operation drain resistance is mimicked in response to the control circuit biasing a predetermined quantity of unselected word lines of a series string, between a selected word line and a bit line, with a modified pass voltage that is determined in response to the program verify operation drain resistance, the control circuit further adapted to bias remaining unselected word lines of the series string with a pass voltage that is greater than the modified pass voltage.

18. The memory device of claim 17 wherein the memory array has a NAND architecture.

19. The memory device of claim 17 wherein the memory array is comprised of a plurality of flash memory cells.

20. A memory system comprising:
a processor for generating memory signals for the system; and
a memory device coupled to the processor that operates in response to the memory signals, the memory device comprising:
  a memory array comprising a plurality of rows coupled by word lines and a plurality of memory cell series string columns, each coupled between a source line and a bit line; and
  a memory control circuit coupled to the memory array and adapted to control operation of the memory device such that a program verify operation drain resistance is mimicked in response to the control circuit biasing a predetermined quantity of unselected word lines of a series string, between a selected word line and a bit line, with a modified pass voltage that is determined in response to the program verify operation drain resistance, the control circuit further adapted to bias remaining unselected word lines of the series string with a pass voltage that is greater than the modified pass voltage.

21. The system of claim 20 wherein the memory signals comprise control, data, and address signals.

22. The system of claim 20 wherein the memory device is a NAND flash memory device.

23. The system of claim 20 wherein the program verify operation drain resistance is a resistance of a plurality of programmed memory cells acting as pass-gates during a program verify operation.

24. A memory module comprising:
at least two memory devices, each comprising:
  a memory array comprising a plurality of rows coupled by word lines and a plurality of memory cell series string columns, each coupled between a source line and a bit line; and
  a memory control circuit coupled to the memory array and adapted to control operation of the memory device such that a program verify operation drain resistance is mimicked in response to the control circuit biasing a predetermined quantity of unselected word lines of a series string, between a selected word line and a bit line, with a modified pass voltage that is determined in response to the program verify operation drain resistance, the control circuit further adapted to bias remaining unselected word lines of the series string with a pass voltage that is greater than the modified pass voltage; and
a plurality of contacts configured to provide selective contact between each memory device and a host system.

25. The module of claim 24 and further including a processor coupled to the at least two memory devices for controlling operation of the memory module in response to the host system.

26. A memory module comprising:
a memory device comprising:
  a memory array comprising a plurality of rows coupled by word lines and a plurality of memory cell series string columns, each coupled between a source line and a bit line; and
  a memory control circuit coupled to the memory array and adapted to control operation of the memory device such that a program verify operation drain resistance is mimicked in response to the control circuit biasing a predetermined quantity of unselected word lines of a series string, between a selected word line and a bit line, with a modified pass voltage that is determined in response to the program verify operation drain resistance, the control circuit further adapted to bias remaining unselected word lines of the series string with a pass voltage that is greater than the modified pass voltage;
a housing for enclosing the memory device; and
a plurality of contacts coupled to the housing and configured to provide selective contact between the memory device and a host system.

* * * * *